United States Patent
Yang

(10) Patent No.: US 9,234,373 B2
(45) Date of Patent: Jan. 12, 2016

(54) BACK COVER WITH ANTI-THEFT FUNCTION AND DISPLAY MONITOR THEREOF

(71) Applicant: Wistron Corporation, New Taipei (TW)

(72) Inventor: Sliphen Yang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 10 days.

(21) Appl. No.: 14/485,807

(22) Filed: Sep. 15, 2014

(65) Prior Publication Data

US 2015/0211264 A1 Jul. 30, 2015

(30) Foreign Application Priority Data

Jan. 29, 2014 (CN) .......................... 2014 1 0043173

(51) Int. Cl.
  *G06F 1/16* (2006.01)
  *E05B 73/00* (2006.01)
  *H05K 5/02* (2006.01)

(52) U.S. Cl.
  CPC .......... *E05B 73/0082* (2013.01); *H05K 5/0208* (2013.01); *H05K 5/0221* (2013.01)

(58) Field of Classification Search
  CPC .. H05K 5/0017; H05K 5/0208; H05K 5/0021
  USPC .................................... 361/679.57
  See application file for complete search history.

(56) References Cited

U.S. PATENT DOCUMENTS 8,083,193 B2 12/2011 Matsui
8,717,751 B2 * 5/2014 Marker ................ H05K 5/0004
  361/679.01
2010/0269552 A1* 10/2010 Morrison ............ E05B 73/0005
  70/58
2010/0320884 A1* 12/2010 Shiroishi ................. G06F 21/88
  312/223.1
2011/0080707 A1* 4/2011 Mahaffey ............ E05B 73/0005
  361/679.57

FOREIGN PATENT DOCUMENTS

TW M425912 4/2012
TW M463855 10/2013

OTHER PUBLICATIONS

Office action mailed on Jun. 24, 2015 for the Taiwan application No. 103106844, filing date: Feb. 27, 2014, p. 4 line 5-26, p. 5-12 and p. 13 line 1-12.

* cited by examiner

*Primary Examiner* — Anthony Q Edwards
(74) *Attorney, Agent, or Firm* — Winston Hsu; Scott Margo

(57) ABSTRACT

A back cover with an anti-theft function is for containing a monitor body cooperatively with a front frame and includes a reinforcement rib structure and a cover body having an anti-theft hole. The reinforcement rib structure is formed on an inner side of the cover body facing the monitor body and includes a first ring-shaped rib disposed around the anti-theft hole, a second ring-shaped rib disposed around the first ring-shaped rib, two longitudinal ribs, and four transverse ribs. The two longitudinal ribs extend respectively from a top end and a bottom end of the first ring-shaped rib to the second ring-shaped rib along a center longitudinal axis of the first ring-shaped rib. The four transverse ribs extend respectively from two sides of the first ring-shaped rib to the second ring-shaped rib along a center transverse axis of the first ring-shaped rib in a symmetrical arrangement.

16 Claims, 6 Drawing Sheets

BACK COVER WITH ANTI-THEFT FUNCTION AND DISPLAY MONITOR THEREOF

BACKGROUND OF THE INVENTION

1. Field of the Invention

The present invention relates to a back cover and a display monitor thereof, and more specifically, to a back cover with an anti-theft function and a display monitor thereof.

2. Description of the Prior Art

In general, a display monitor usually has an anti-theft function for preventing being taken away or stolen arbitrarily. The conventional anti-theft design is to form an anti-theft hole on a back cover of the display monitor for a user to insert an anti-theft key into the anti-theft hole, so that the display monitor could be locked on an installation platform (e.g. a wall mount or a table) for anti-theft. Furthermore, in practical application, a reinforcement metal sheet (e.g. an iron sheet) is additionally fixed on an inner side of the back cover corresponding to the anti-theft hole by a hot melting process for further increasing the structural strength of the anti-theft hole. In such a manner, the aforesaid design could effectively prevent the display monitor from being taken away by other person violently pulling the anti-theft key to break the anti-theft hole.

However, since the aforesaid reinforcement design needs an operator to manually position the reinforcement metal sheet at a right position corresponding to the anti-theft hole during the hot melting process, it would cause a time-consuming and strenuous manufacturing process so as to greatly increase the manufacturing cost of the display monitor in the anti-theft design. Furthermore, the aforesaid reinforcement design usually causes the reinforcement metal sheet to fall out of the back cover due to poor melt quality, so that the loose reinforcement metal sheet could hit the internal components of the display monitor to cause damage of the internal components or make annoying sound.

SUMMARY OF THE INVENTION

An objective of the present invention is to provide a back cover with an anti-theft function and a display monitor thereof, to solve the aforesaid problem.

The present invention provides a back cover with an anti-theft function for containing a monitor body cooperatively with a front frame. The back cover includes a cover body and a reinforcement rib structure. The cover body has an anti-theft hole. The reinforcement rib structure is formed on an inner side of the cover body facing the monitor body. The reinforcement rib structure includes a first ring-shaped rib, a second ring-shaped rib, at least two longitudinal ribs, and at least four transverse ribs. The first ring-shaped rib is disposed around the anti-theft hole. The second ring-shaped rib is disposed around the first ring-shaped rib. The at least two longitudinal ribs extend from a top end and a bottom end of the first ring-shaped rib respectively to the second ring-shaped rib along a center longitudinal axis of the first ring-shaped rib. The at least four transverse ribs extend from two sides of the first ring-shaped rib respectively to the second ring-shaped rib along a center transverse axis of the first ring-shaped rib in a symmetrical arrangement.

According to the claimed invention, the cover body further has a concave structure formed on the inner side of the cover body, and the reinforcement rib structure is located in the concave structure.

According to the claimed invention, a sum of a thickness of the cover body and a thickness of the reinforcement rib structure is less than an extending length of an anti-theft key relative to the cover body after passing through the anti-theft hole.

According to the claimed invention, the sum of the thickness of the cover body and the thickness of the reinforcement rib structure is less than 4 mm.

According to the claimed invention, the thickness of the cover body is substantially equal to 2.5 mm, and the thickness of the reinforcement rib structure is substantially equal to 1.2 mm.

According to the claimed invention, a rib width of the first ring-shaped rib is between 1 mm and 1.2 mm, and a rib width of the second ring-shaped rib is between 1 mm and 1.4 mm.

According to the claimed invention, the first ring-shaped rib and the second ring-shaped rib have four arc-shaped corners respectively, and a central angle of each arc-shaped corner of the first ring-shaped rib and a central angle of each arc-shaped corner of the second ring-shaped rib are between 90° and 180°.

According to the claimed invention, an internal width of the first ring-shaped rib is substantially equal to 3 mm, an internal length of the first ring-shaped rib is substantially equal to 7 mm, an outer width of the second ring-shaped rib is substantially equal to 10.7 mm, and an outer length of the second ring-shaped rib is substantially equal to 14.8 mm.

The present invention further provides a display monitor with an anti-theft function. The display monitor includes a monitor body, a front frame, and a back cover. The back cover is connected to the front frame for containing the monitor body cooperatively with the front frame. The back cover includes a cover body and a reinforcement rib structure. The cover body has an anti-theft hole. The reinforcement rib structure is formed on an inner side of the cover body facing the monitor body. The reinforcement rib structure includes a first ring-shaped rib, a second ring-shaped rib, at least two longitudinal ribs, and at least four transverse ribs. The first ring-shaped rib is disposed around the anti-theft hole. The second ring-shaped rib is disposed around the first ring-shaped rib. The at least two longitudinal ribs extend from a top end and a bottom end of the first ring-shaped rib respectively to the second ring-shaped rib along a center longitudinal axis of the first ring-shaped rib. The at least four transverse ribs extend from two sides of the first ring-shaped rib respectively to the second ring-shaped rib along a center transverse axis of the first ring-shaped rib in a symmetrical arrangement.

In summary, compared with prior art fixing the reinforcement metal sheet on the inner side of the back cover corresponding to the anti-theft hole by a hot melting process, the present invention adopts the design in which the reinforcement rib structure is integrally formed on the back cover and the longitudinal ribs and the transverse ribs are connected between the first ring-shaped rib and the second ring-shaped rib in a symmetrical arrangement, to achieve the purpose that the anti-theft hole could have sufficient structural strength via the reinforcement rib structure, so as to effectively prevent the display monitor 10 from being taken away by other person violently breaking the anti-theft hole. In such a manner, since there is no need to manually position the reinforcement metal sheet at a right position corresponding to the anti-theft hole, the present invention not only reduces the manufacturing cost of the display monitor in the anti-theft design, but also solves the prior art problem that the loose reinforcement metal could hit the internal components of the display monitor to cause damage of the internal components or make annoying sound.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
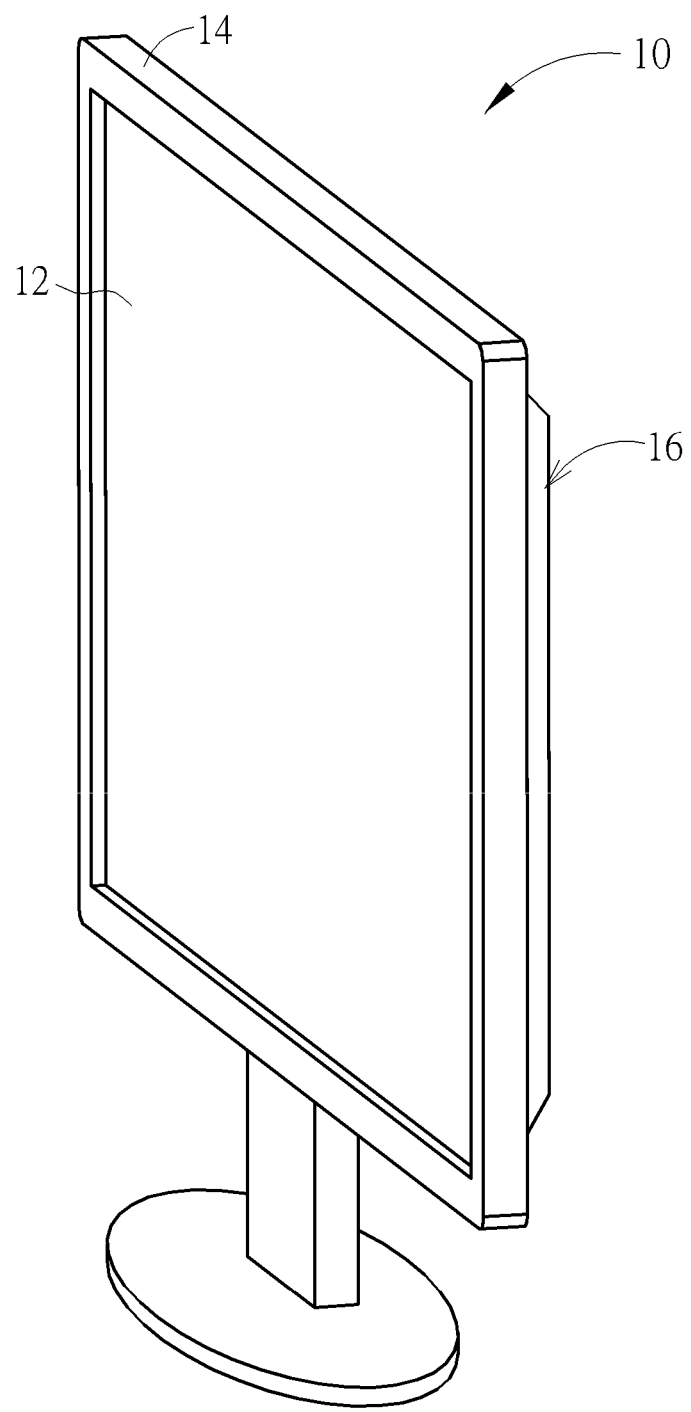
FIG. 1 is a diagram of a display monitor according to an embodiment of the present invention.

Please refer to FIG. 1, which is a diagram of a display monitor 10 according to an embodiment of the present invention. As shown in FIG. 1, the display monitor 10 includes a monitor body 12, a front frame 14, and a back cover 16. The monitor 12 could include major components of the display monitor 10 besides the front frame 14 and the back cover 16, such as a display panel and a backlight module, and the related description is omitted herein since it is commonly seen in the prior art. The front frame 14 is connected to the back cover 16 to cooperatively form a monitor casing for containing the monitor body 12, so as to achieve the protection and dustproof purposes.

Figure 2:
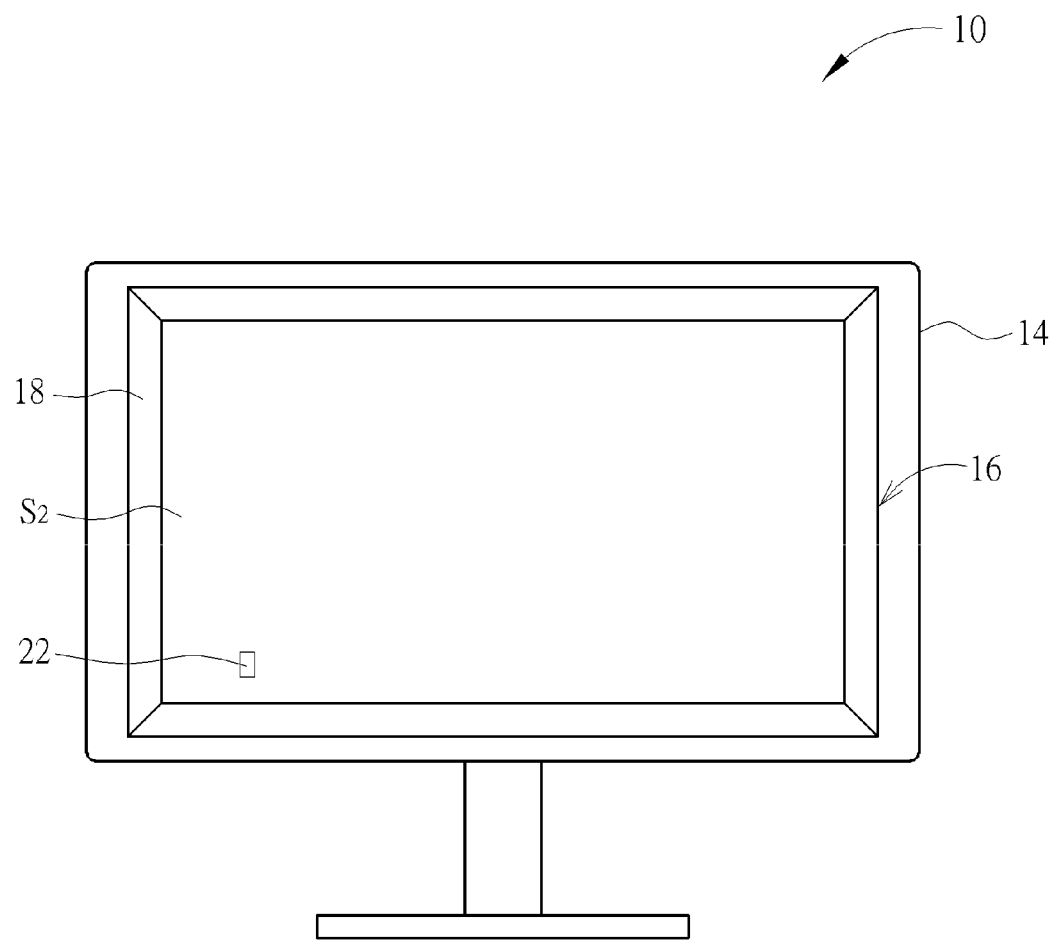
FIG. 2 is a rear view of the display monitor in FIG. 1.
Figure 3:
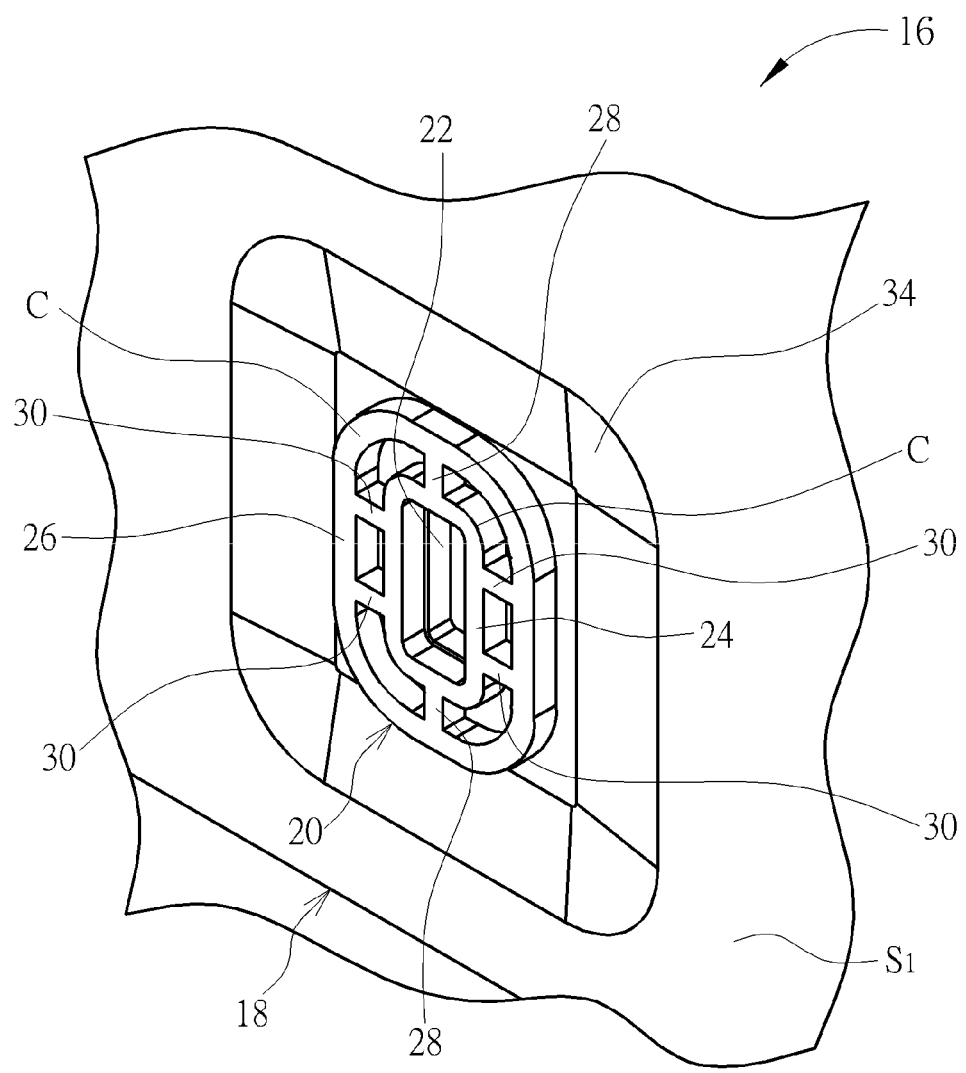
FIG. 3 is a partial inner enlarged diagram of a back cover in FIG. 2.
Figure 4:
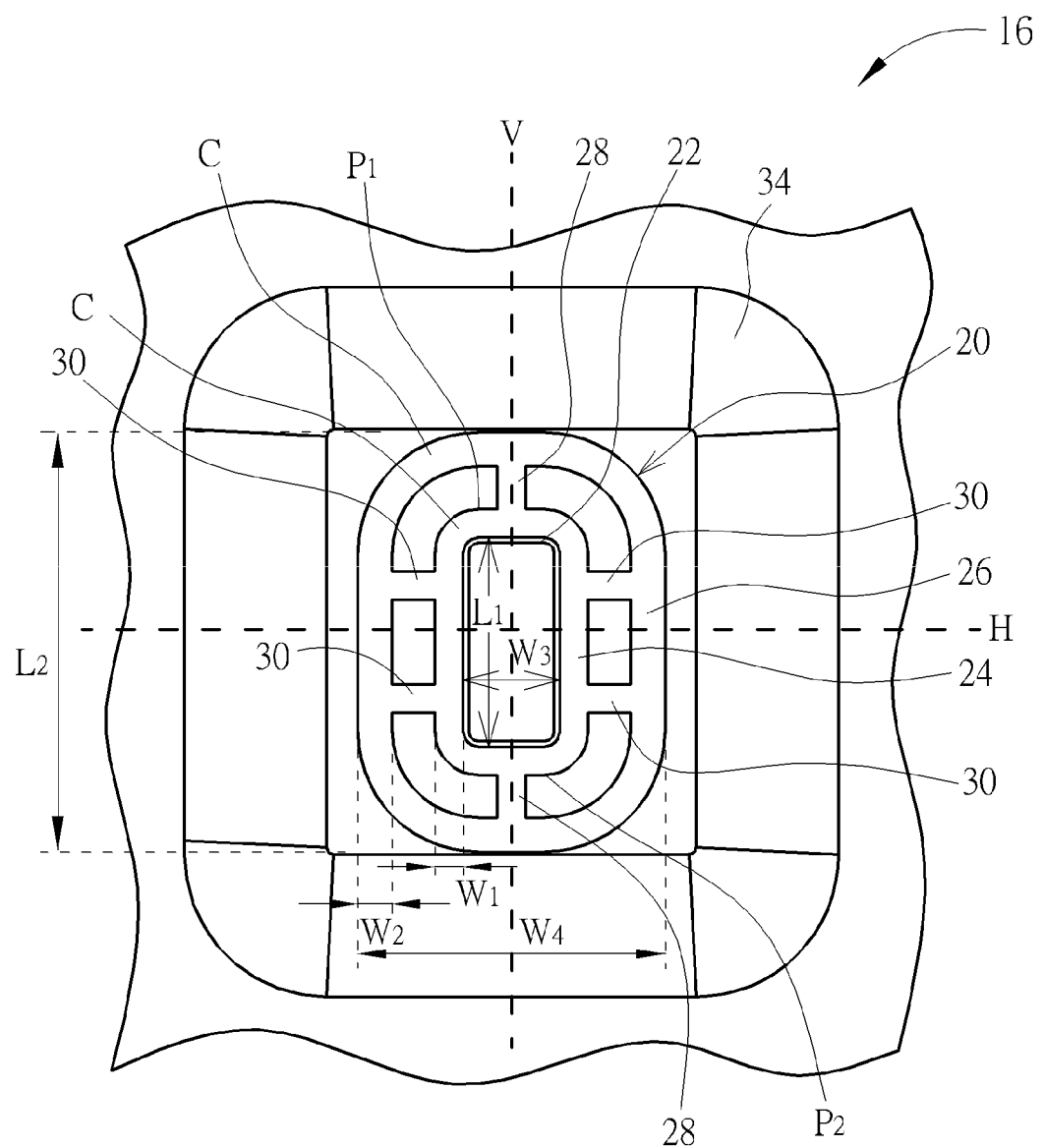
FIG. 4 is a top view of the back cover in FIG. 3.

Please refer to FIG. 2, FIG. 3, and FIG. 4. FIG. 2 is a rear view of the display monitor 10 in FIG. 1. FIG. 3 is a partial inner enlarged diagram of the back cover 16 in FIG. 2. FIG. 4 is a top view of the back cover 16 in FIG. 3. As shown in FIG. 2, FIG. 3, and FIG. 4, the back cover 16 includes a cover body 18 and a reinforcement rib structure 20. The cover body 18 has an anti-theft hole 22 for a user to insert an anti-theft key so as to complete an anti-theft operation of the display monitor 10. The reinforcement rib structure 20 is formed on an inner side $S_1$ of the cover body 18 facing the monitor body 12. The manufacturing process for forming the reinforcement rib structure 20 on the cover body 18 could be an integrally-forming process, such as an injection molding process, and the related description is omitted herein since it is commonly seen in the prior art. The reinforcement rib structure 20 includes a first ring-shaped rib 24, a second ring-shaped rib 26, at least two longitudinal ribs 28 (two respectively shown in FIG. 3 and FIG. 4, but not limited thereto), and at least four transverse ribs 30 (four respectively shown in FIG. 3 and FIG. 4, but not limited thereto). The first ring-shaped rib 24 and the second ring-shaped rib 26 preferably have an elliptical shape, but not limited thereto. The first ring-shaped rib 24 is disposed around the anti-theft hole 22. The second ring-shaped rib 26 is disposed around the first ring-shaped rib 24. The two longitudinal ribs 28 extend from a top end $P_1$ and a bottom end $P_2$ of the first ring-shaped rib 24 respectively to the second ring-shaped rib 26 along a center longitudinal axis V of the first ring-shaped rib 24. The four transverse ribs 30 extend from two sides of the first ring-shaped rib 24 respectively to the second ring-shaped rib 26 along a central transverse axis H in a symmetrical arrangement.

According to the practical experiences, in this embodiment, a rib width $W_1$ of the first ring-shaped rib 24 is preferably between 1 mm and 2 mm and a rib width $W_2$ of the second ring-shaped rib 26 is preferably between 1 mm and 1.4 mm, so as to ensure that the reinforcement rib structure 20 could have sufficient structural strength and to effectively prevent inward shrinking of the reinforcement rib structure 20 after the reinforcement rib structure 20 is integrally formed with the back cover 16 in the case of the reinforcement rib structure 20 having an excessive rib width. Furthermore, an internal width $W_3$ of the first ring-shaped rib 24 is preferably equal to 3 mm, an internal length $L_1$ of the first ring-shaped rib 24 is preferably equal to 7 mm, an outer width $W_4$ of the second ring-shaped rib 26 is preferably equal to 10.7 mm, and the an outer length $L_2$ of the second ring-shaped rib 26 is preferably equal to 14.8 mm. To be noted, the sizes of the first ring-shaped rib 24 and the second ring-shaped rib 26 could vary with the practical application of the reinforcement rib structure 20. Furthermore, in this embodiment, the first ring-shaped rib 24 and the second ring-shaped rib 26 could have four arc-shaped corners C respectively so that the reinforcement rib structure 20 could receive force uniformly. A central angle of each arc-shaped corner C of the first ring-shaped rib 24 and a central angle of each arc-shaped corner C of the second ring-shaped rib 26 are between 90° and 180°.

Figure 5:
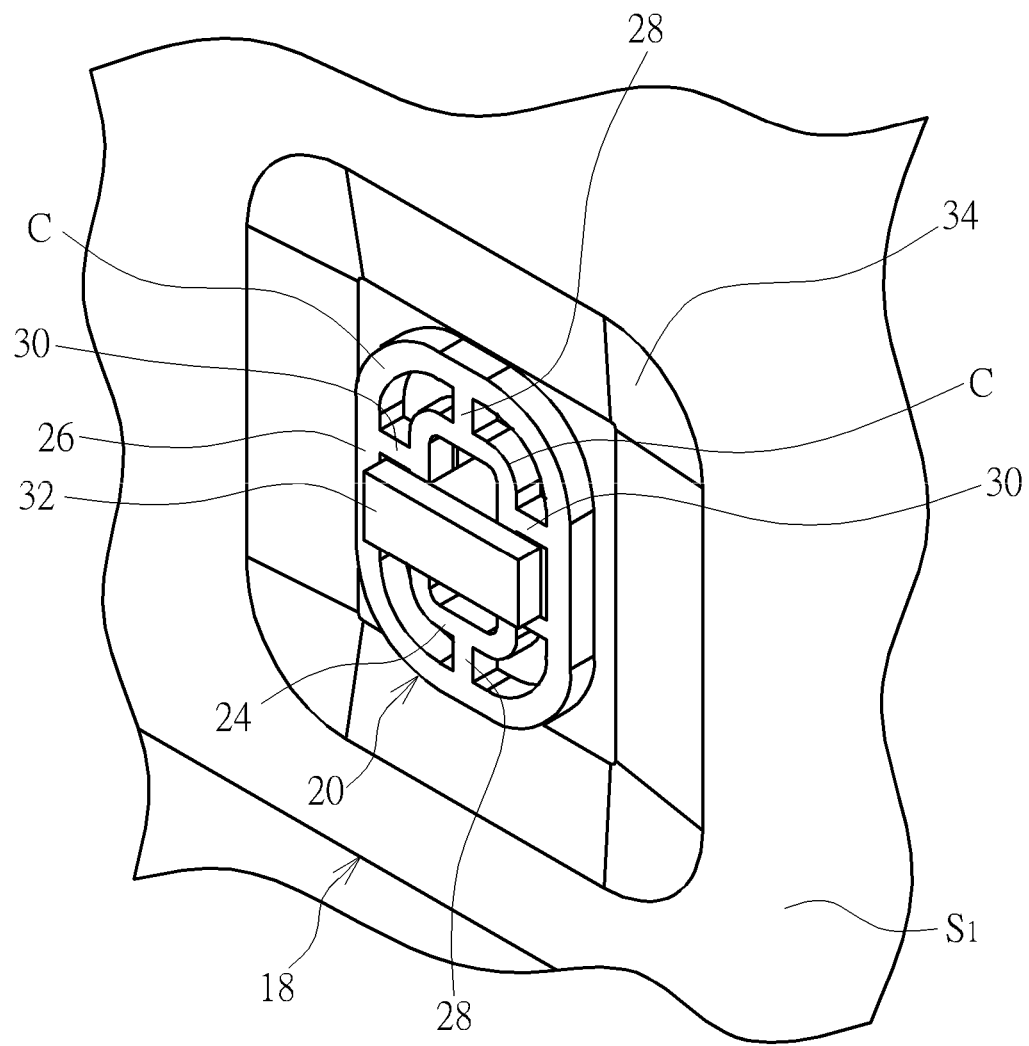
FIG. 5 is a diagram of an anti-theft key extending out of a reinforcement rib structure in FIG. 3 and then being misaligned with the reinforcement rib structure.
Figure 6:
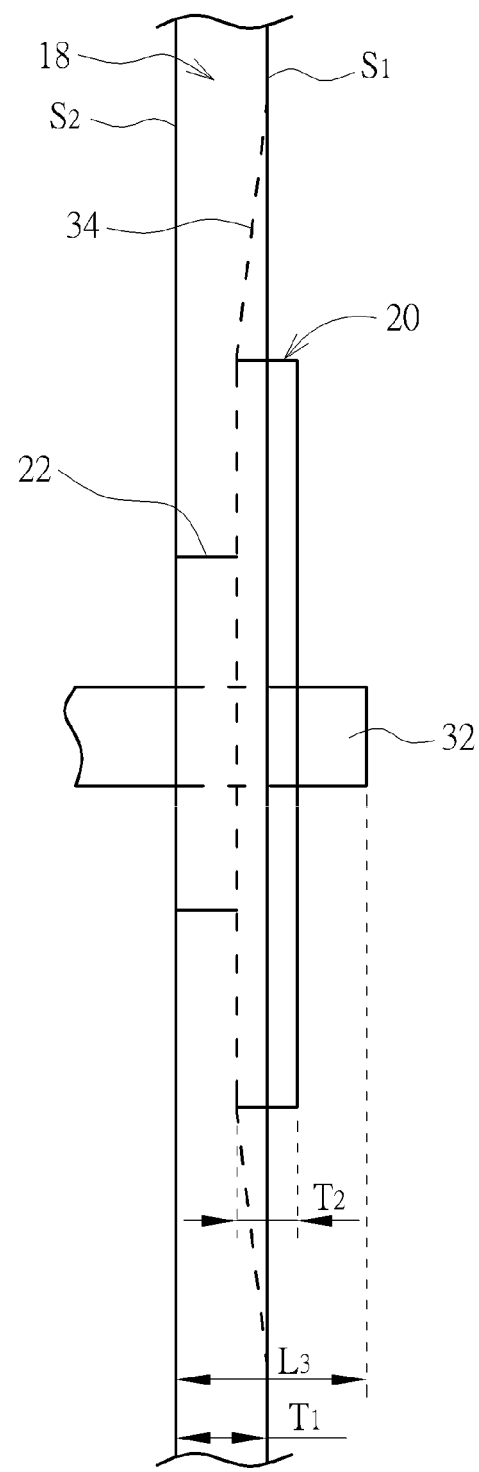
FIG. 6 is a side view of the anti-theft key extending out of the reinforcement rib structure in FIG. 5 and then being misaligned with the reinforcement rib structure.

Furthermore, please refer to FIG. 3, FIG. 5, and FIG. 6. FIG. 5 is a diagram of an anti-theft key 32 extending out of the reinforcement rib structure 20 in FIG. 3 and then being misaligned with the reinforcement rib structure 20. FIG. 6 is a side view of the anti-theft key 32 extending out of the reinforcement rib structure 20 in FIG. 5 and then being misaligned with the reinforcement rib structure 20. The anti-theft key 32 is partially depicted in FIG. 6. The anti-theft key 32 could adopt the conventional key design commonly applied to a display monitor, such as a chain-type T-shaped key, and the related description is omitted herein since it is commonly seen in the prior art. As shown in FIG. 3, the cover body 18 further has a concave structure 34. The concave structure 34 could be formed on the inner side $S_1$ of the cover body 18 and the reinforcement rib structure 20 could be located in the concave structure 34. Accordingly, the present invention could effectively reduce a protruding height of the reinforcement rib structure 20 relative to the inner side $S_1$ of the cover body 18, so as to prevent interference between the reinforcement structure 20 and the internal components of the monitor body 12. Furthermore, as shown in FIG. 5 and FIG. 6, in this embodiment, a sum of a thickness $T_1$ of the cover body 18 and a thickness $T_2$ of the reinforcement rib structure 20 could be less than an extending length $L_3$ of the anti-theft key 32 relative to an outer side $S_2$ (opposite to the inner side $S_1$) of the cover body 18 after passing through the anti-theft hole 22, so as to ensure that the anti-theft key 32 could extend out of the reinforcement rib structure 20 and then be misaligned with the reinforcement rib structure 20 for achieving the anti-theft purpose. In practical application, the sum of the thickness $T_1$ of the cover body 18 and the thickness $T_2$ of the reinforcement rib structure 20 is preferably less than 4 mm. To be more specific, in this embodiment, the thickness $T_1$ of the cover body 18 could be equal to 2.5 mm and the thickness $T_2$ of the reinforcement rib structure 20 could be equal to 1.2 mm (but not limited thereto).

In such a manner, via the aforesaid design for integrally forming the reinforcement rib structure 20 on the back cover 16, the present invention could generate the effect that the anti-theft key 32 could only abut against the first ring-shaped rib 24 and the second ring-shaped rib 26 without contacting with the cover body 18, so as to prevent the anti-theft key 32 from directly exerting force upon the cover body 18 to cause deformation of the cover body 18. Furthermore, via the connection design in which the longitudinal ribs 28 and the transverse ribs 30 are connected between the first ring-shaped rib 24 and the second ring-shaped rib 26, the present invention could further make the reinforcement rib structure 20 capable of receiving force uniformly via force transmission among the longitudinal ribs 28, the transverse ribs 30, the first ring-shaped rib 24, and the second ring-shaped rib 26, so as to prevent fracture of the longitudinal ribs 28, the transverse ribs 30, the first ring-shaped rib 24, and the second ring-shaped rib 26 due to stress concentration. In summary, the anti-theft hole 22 could have sufficient structural strength via the reinforcement rib structure 20 to provide a reliable anti-theft function after the user inserts the anti-theft key 32 into the anti-theft hole 22 and then rotate the anti-theft key 32 to be misaligned with the reinforcement rib structure 20. In such a manner, the present invention could effectively prevent the display monitor 10 from being taken away by other person violently pulling the anti-theft key 32 to break the anti-theft hole 22.

Compared with prior art fixing the reinforcement metal sheet on the inner side of the back cover corresponding to the anti-theft hole by a hot melting process, the present invention adopts the design in which the reinforcement rib structure is integrally formed on the back cover and the longitudinal ribs and the transverse ribs are connected between the first ring-shaped rib and the second ring-shaped rib in a symmetrical arrangement, to achieve the purpose that the anti-theft hole could have sufficient structural strength via the reinforcement rib structure, so as to effectively prevent the display monitor 10 from being taken away by other person violently breaking the anti-theft hole. In such a manner, since there is no need to manually position the reinforcement metal sheet at a right position corresponding to the anti-theft hole, the present invention not only reduces the manufacturing cost of the display monitor in the anti-theft design, but also solves the prior art problem that the loose reinforcement metal could hit the internal components of the display monitor to cause damage of the internal components or make annoying sound.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A back cover with an anti-theft function for containing a monitor body cooperatively with a front frame, the back cover comprising:
   a cover body having an anti-theft hole; and
   a reinforcement rib structure formed on an inner side of the cover body facing the monitor body, the reinforcement rib structure comprising:
      a first ring-shaped rib disposed around the anti-theft hole;
      a second ring-shaped rib disposed around the first ring-shaped rib;
      at least two longitudinal ribs extending from a top end and a bottom end of the first ring-shaped rib respectively to the second ring-shaped rib along a center longitudinal axis of the first ring-shaped rib; and
      at least four transverse ribs extending from two sides of the first ring-shaped rib respectively to the second ring-shaped rib along a center transverse axis of the first ring-shaped rib in a symmetrical arrangement.

2. The back cover of claim 1, wherein the cover body further has a concave structure formed on the inner side of the cover body, and the reinforcement rib structure is located in the concave structure.

3. The back cover of claim 1, wherein a sum of a thickness of the cover body and a thickness of the reinforcement rib structure is less than an extending length of an anti-theft key relative to the cover body after passing through the anti-theft hole.

4. The back cover of claim 3, wherein the sum of the thickness of the cover body and the thickness of the reinforcement rib structure is less than 4 mm.

5. The back cover of claim 4, wherein the thickness of the cover body is substantially equal to 2.5 mm, and the thickness of the reinforcement rib structure is substantially equal to 1.2 mm.

6. The back cover of claim 1, wherein a rib width of the first ring-shaped rib is between 1 mm and 1.2 mm, and a rib width of the second ring-shaped rib is between 1 mm and 1.4 mm.

7. The back cover of claim 6, wherein the first ring-shaped rib and the second ring-shaped rib have four arc-shaped corners respectively, and a central angle of each arc-shaped corner of the first ring-shaped rib and a central angle of each arc-shaped corner of the second ring-shaped rib are between 90° and 180°.

8. The back cover of claim 7, wherein an internal width of the first ring-shaped rib is substantially equal to 3 mm, an internal length of the first ring-shaped rib is substantially equal to 7 mm, an outer width of the second ring-shaped rib is substantially equal to 10.7 mm, and an outer length of the second ring-shaped rib is substantially equal to 14.8 mm.

9. A display monitor with an anti-theft function, the display monitor comprising:
   a monitor body;
   a front frame; and
   a back cover connected to the front frame for containing the monitor body cooperatively with the front frame, the back cover comprising:
      a cover body having an anti-theft hole; and
      a reinforcement rib structure formed on an inner side of the cover body facing the monitor body, the reinforcement rib structure comprising:
         a first ring-shaped rib disposed around the anti-theft hole;
         a second ring-shaped rib disposed around the first ring-shaped rib;
         at least two longitudinal ribs extending from a top end and a bottom end of the first ring-shaped rib respectively to the second ring-shaped rib along a center longitudinal axis of the first ring-shaped rib; and
         at least four transverse ribs extending from two sides of the first ring-shaped rib respectively to the second ring-shaped rib along a center transverse axis of the first ring-shaped rib in a symmetrical arrangement.

10. The display monitor of claim 9, wherein the cover body further has a concave structure formed on the inner side of the cover body, and the reinforcement rib structure is located in the concave structure.

11. The display monitor of claim 9, wherein a sum of a thickness of the cover body and a thickness of the reinforcement rib structure is less than an extending length of an anti-theft key relative to the cover body after passing through the anti-theft hole.

12. The display monitor of claim 11, wherein the sum of the thickness of the cover body and the thickness of the reinforcement rib structure is less than 4 mm.

13. The display monitor of claim 12, wherein the thickness of the cover body is substantially equal to 2.5 mm, and the thickness of the reinforcement rib structure is substantially equal to 1.2 mm.

14. The display monitor of claim 9, wherein a rib width of the first ring-shaped rib is between 1 mm and 1.2 mm, and a rib width of the second ring-shaped rib is between 1 mm and 1.4 mm.

15. The display monitor of claim 14, wherein the first ring-shaped rib and the second ring-shaped rib have four arc-shaped corners respectively, and a central angle of each arc-shaped corner of the first ring-shaped rib and a central angle of each arc-shaped corner of the second ring-shaped rib are between 90° and 180°.

16. The display monitor of claim 15, wherein an internal width of the first ring-shaped rib is substantially equal to 3 mm, an internal length of the first ring-shaped rib is substantially equal to 7 mm, an outer width of the second ring-shaped rib is substantially equal to 10.7 mm, and an outer length of the second ring-shaped rib is substantially equal to 14.8 mm.

\* \* \* \* \*